United States Patent
Koduri

[11] Patent Number: 6,006,977
[45] Date of Patent: Dec. 28, 1999

[54] WIRE BONDING CAPILLARY ALIGNMENT DISPLAY SYSTEM

[75] Inventor: Sreenivasan K. Koduri, Dallas, Tex.

[73] Assignee: Texas Instruments Incorporated, Dallas, Tex.

[21] Appl. No.: 08/993,101

[22] Filed: Dec. 18, 1997

Related U.S. Application Data

[60] Provisional application No. 60/033,513, Dec. 19, 1996.

[51] Int. Cl.$^6$ .............................. B23K 37/00; B23K 1/06; B23K 13/08; B32B 31/16
[52] U.S. Cl. ................................ 228/4.5; 228/1.1; 228/8; 228/180.5; 156/73.2
[58] Field of Search ................................... 228/1.1, 4.5, 8, 228/102, 110.1, 180.5; 156/73.2, 580.1

[56] References Cited

U.S. PATENT DOCUMENTS

| | | | |
|---|---|---|---|
| 4,821,945 | 4/1989 | Chase et al. | 228/180.5 |
| 4,976,392 | 12/1990 | Smith et al. | 228/102 |
| 5,230,458 | 7/1993 | Asanasavest | 228/102 |
| 5,465,899 | 11/1995 | Quick et al. | 228/180.5 |
| 5,544,804 | 8/1996 | Test et al. | 228/180 |
| 5,558,270 | 9/1996 | Nachon et al. | 228/180.5 |

FOREIGN PATENT DOCUMENTS

| | | |
|---|---|---|
| 403250640 | 11/1991 | Japan . |
| 405090321 | 4/1993 | Japan . |

*Primary Examiner*—Patrick Ryan
*Assistant Examiner*—Kiley Stoner
*Attorney, Agent, or Firm*—Wade James Brady III; Richard L. Donaldson

[57] ABSTRACT

An alignment system is provided for aligning a wire bonding capillary. The system includes at least one indicator coupled to the capillary. The system can include a plurality of indicators on the capillary and one or more detectors spaced from the capillary. An indicator and detector cooperate to produce a signal having a strength. The strength of the signal is based on the distance between the indicator and the detector. The signal strength corresponds to a rotational alignment of the capillary. The system further includes a display for displaying the strength of the signal. The at least one indicator or the at least one detector may be coupled to a computer which controls rotation of the capillary. The various system components can be incorporated into a wire bonding machine upon which the capillary is mounted.

20 Claims, 3 Drawing Sheets

WIRE BONDING CAPILLARY ALIGNMENT DISPLAY SYSTEM

This application claims priority under 35 USC § 119(e)(1) of provisional application No. 60/033,513 filed Dec. 19, 1996.

TECHNICAL FIELD OF THE INVENTION

The present invention generally relates to a wire bonding process and capillaries used in the wire bonding process during the manufacture of electronic integrated circuit chip packages and, more particularly, to a wire bonding capillary alignment display system.

BACKGROUND OF THE INVENTION

Integrated circuit chip packages are typically formed by mounting an integrated circuit chip on a lead frame and coupling these two elements to form a package. The integrated circuit chip and lead frame may be encapsulated. Typically, the chip includes a number of bond pads which may be positioned about a perimeter of the chip according to a predetermined spacing between the bond pads. The lead frame typically includes a number of leads about a perimeter thereof. One type of lead frame, for example, has a generally rectangular shape with each side of the rectangle having a number of leads. The leads may each have a relatively narrow elongated shape.

A lead frame may be said to have an X direction and a Y direction. The X direction is perpendicular to one pair of opposing sides and the Y direction is perpendicular to the other pair of opposing sides. Typically, each lead has a relatively narrow elongated shape defining a lead axis. The lead axis for any given lead frame may extend in the X or Y direction, or be offset by an angle from either the X or Y direction. The angle of offset may vary from lead to lead. Moving from the center of a given side of the lead frame toward the corner leads, the lead axes may be angularly offset from perpendicular by increasing amounts. Also, a bonding path is defined by the direction from a bond pad to a corresponding lead. The bonding wire may extend along the bonding path. For any given set of corresponding bond pads and leads, the bonding path may extend in the X or Y direction, or be offset by an angle from either the X or Y direction.

In order to electrically couple the integrated circuit chip to the leads of the lead frame, a wire bonding technique is often used. A wire bonding machine may have a spool of bonding wire mounted on the machine. The bonding wire may be threaded through a capillary which is mounted to a horn of the wire bonding machine. The horn may be manipulated to move the capillary both vertically and horizontally. Typically, the wire bonding machine includes a device for heating or applying a spark to an end of the bonding wire which protrudes from an exit end of the capillary. The molten wire may form the shape of a ball which is placed on a target bond pad by manipulating the horn to move the capillary.

After this bond pad bond is created, a sufficient amount of bonding wire is released to allow the capillary to be moved to a location near an inner end of a target lead of the lead frame. The capillary is manipulated to connect the bonding wire to the inner end of the target lead and cut off the bonding wire so that the bonding wire protruding from the exit end of the capillary is now free to form a new wire bond between a new target bond pad and target lead. Any type of suitable bond may be made at either the bond pad or the lead, including ball bonds, stitch bonds and wedge bonds. A ball bond may be used, for example, at the bond pad. A stitch bond may be used, for example, at the lead. To complement the bonding process the package may be heated. Also, ultrasonic energy may be applied.

Problems in wire bonding techniques arise in part from the desire to increase the number of leads in a given package and to make integrated circuit chip packages smaller and smaller. This may require that the bonding pads located on the chip be made smaller and be spaced closer together. The same can be said for the leads on a lead frame.

The exit end of a wire bonding capillary is often referred to as the capillary face. Previous capillaries have had a circular face. A disadvantage of having a capillary with a circular face is that the spacing between bonds is limited. After a bond is made at a particular bond pad, for example, if the adjacent bond pad is too close then the capillary face may strike the ball bond which has been made at the first bond pad during the process of making a bond on the adjacent bond pad. One method for solving this shortcoming is to use a wire bonding capillary with a non-circular face. This type of approach is shown, for example, in U.S. Pat. No. 5,544,804 issued to Test et al., which is hereby incorporated by reference for all purposes. The Test et al. patent shows a BowTI™ capillary having a non-circular face. The face of a BowTI™ capillary may have a shape which includes a pair of opposed convex sides joining a pair of opposed concave sides. The BowTI™ capillary may be generally described as having a longitudinal axis extending across the midpoints of the convex sides and through the center of the BowTI™. The BowTI™ capillary allows ball bonds, for example, to be made closer to one another than with a circular capillary face. This can be accomplished because the concave sides avoid striking adjacent bonds. The BowTI™ capillary can also make other types of bonds including stitch bonds.

A need arising from the use of capillaries having non-circular faces is precise alignment of the longitudinal axis of the capillary face along either the X or Y direction of the lead frame, or along the longitudinal axis of a target lead, or along a given bonding path as necessary. Precise alignment of non-circular capillaries is especially difficult due to the relatively small size of a typical capillary face (e.g., 4–8 mils). Improper alignment of the capillary, particularly in view of the decreasing size of integrated circuit chip packages, can lead to defective wire bonds during the manufacturing process. This can result from many factors including improper positioning of the capillary face over the bond pad, the lead or both. Defective wire bonding can also occur when improper alignment causes the capillary to strike and/or damage an existing bond during the formation of a subsequent bond. Other problems, shortcomings and disadvantages of known capillaries and wire bonding techniques exist.

SUMMARY OF THE INVENTION

It is an object of the present invention to address the needs associated with capillaries used in wire bonding.

It is a further object of the present invention to provide a wire bonding system which enables alignment of a capillary during installation of the capillary onto a wire bonding machine.

It is a further object of the present invention to provide a wire bonding system which enables alignment and realignment of a capillary during the process of manufacturing an integrated circuit chip package.

It is a further object of the present invention to provide a computer-controlled wire bonding system in which rotation of a capillary is controlled by a computer in response to information regarding rotational position of the capillary and/or information regarding the orientation of a lead frame.

It is a further object of the present invention to provide a wire bonding system which readily indicates a rotational alignment of a wire bonding capillary to an operator.

To accomplish these and other objects of the present invention, and in accordance with a first embodiment of the present invention, a system is provided for aligning a wire bonding capillary. The system includes at least one indicator located on the capillary. At least one detector cooperates with the at least one indicator to produce a signal corresponding to a rotational alignment of the capillary.

According to a second embodiment, the system includes an indicator located on the capillary and adapted to provide information. A detector is adapted to receive the information from the indicator. The detector produces a signal based on the information received.

According to a third embodiment of the present invention, a wire bonding system is provided. The system includes a wire bonding machine and a capillary rotatably mounted on the wire bonding machine. The system also includes at least one indicator located on the capillary and adapted to produce a signal based on a rotational alignment of the capillary.

According to a feature of the present invention, the alignment system may include one or more displays. The displays are electrically coupled to one or more of the indicators and detectors. The signal or signals produced by the indicators and/or detectors have a relative strength. The signal strength may be based on a distance between the at least one indicator and the at least one detector. Alternatively, a point on the capillary may be established which is closest to the at least one detector. The signal strength may be based on an angular offset between the at least one indicator and the point on the capillary.

The at least one indicator may be a sensor of any suitable type including active, passive, contact, contactless, electrical, mechanical, optical and magnetic indicators and any combination of these. The at least one detector may be any corresponding device, including a transducer, to receive information from the at least one indicator and produce a signal based on the information.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE INVENTION

In general, the present invention provides improved methods and equipment for wire bonding integrated circuit chip packages. A wire bonding system may include a wire bonding machine which has a horn. A capillary is mounted into the horn and guides bonding wire from a source to various bonding points on the integrated circuit chip package. The capillary may have one or more indicators located thereon which provide one or more signals to be received by one or more detectors spaced from the capillary. The signals indicate the rotational alignment of the capillary. Therefore, the signal also indicates the direction of an axis of the face of the capillary. Each signal may have a relative signal strength which indicates an angular offset of the capillary face compared to a predetermined, desired alignment.

During operation, the capillary may be rotated to a first rotational alignment at which the capillary face axis extends in a first direction. A first signal received by the detector indicates when the first rotational alignment has been achieved. A first bond may then be made at a first bond point (e.g., at a bond pad on the integrated circuit chip) by guiding the capillary to the first bond point.

The capillary may then be realigned by rotating the capillary to a second rotational alignment so that the capillary face axis extends in a second direction different from the first direction. A second bond may then be made at a second bond point (e.g., at a lead on the lead frame) by guiding the capillary to the second bond point.

The capillary may then be rotated back to the first direction or to a third direction for a subsequent bond (e.g., at a second bond pad on the integrated circuit chip). Rotation of the capillary is achieved by the cooperation of the indicators and detectors and the production of signals which indicate rotational alignment and realignment. The ability to precisely rotate the capillary is especially beneficial for capillaries with non-circular faces. An axis of a non-circular face is ideally aligned in the direction of bonding when a bond is made. For example, it may be desirable to align the capillary face axis along the lead axis. Furthermore, as wire bonds are made around an integrated circuit chip package, the direction of bonding may change. The present invention is adapted to changing bonding directions. Further aspects of an overall capillary alignment system are disclosed in U.S. patent application Ser. No. 081,993,638 (Attorney Docket No. TI-24970) which is assigned to Texas Instruments Incorporated. This application was filed on Dec. 19, 1996 and is hereby incorporated by reference for all purposes.

The present invention also provides an alignment display system which enables a wire bonding capillary to be rotated to a precise initial alignment or a rotational position offset from the initial alignment during the wire bonding process. Alignment information is provided by one or more sensing devices. This information is transmitted to one or more displays in the form of an electrical signal. The relative strength of the signal indicates the rotational alignment or offset of the capillary with respect to the initial alignment or a desired wire bonding direction (e.g., the axis of a lead frame or an individual lead).

Figure 1:
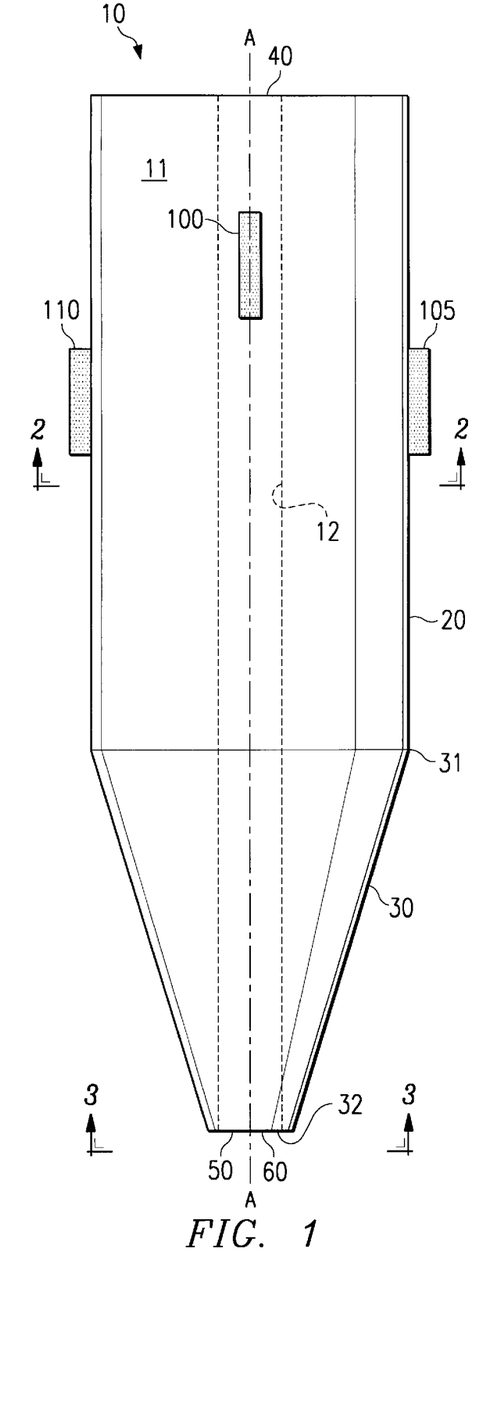
FIG. 1 is a wire bonding capillary in accordance with the present invention.

As shown in greater detail in FIG. 1, capillary 10 has a tubular body comprising a shaft portion 20 which is integral with a tip portion 30. The capillary has a longitudinal bore extending through its interior in the general direction of longitudinal axis AA. The bore of capillary 10 has an entry end 40 and an exit end 50. Bonding wire may be inserted into entry end 40 to extend through the interior of capillary 10 and exit from capillary 10 through exit end 50.

Figure 2:
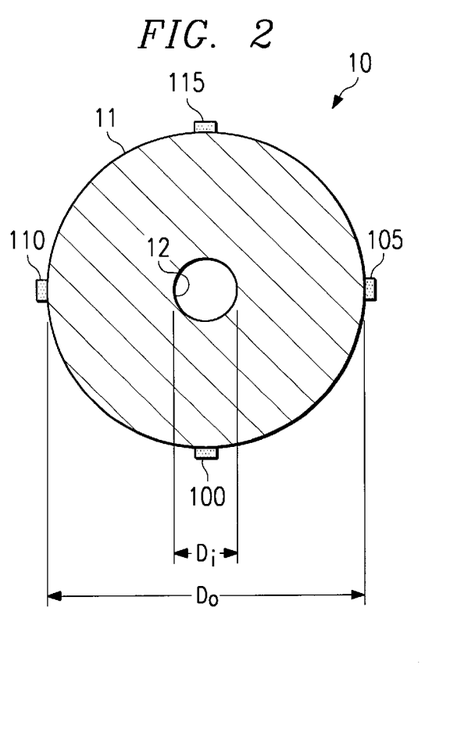
FIG. 2 is a cross section of the wire bonding capillary of FIG. 1 taken along arrows 2—2 in FIG. 1.
Figure 3:
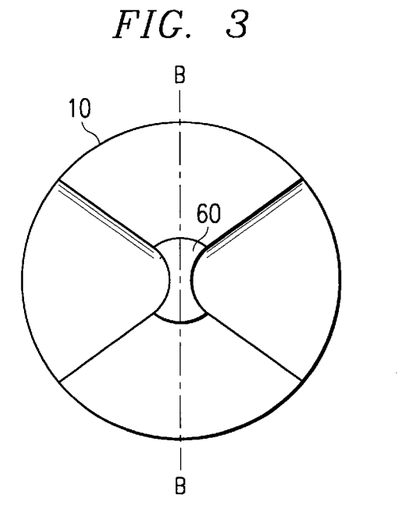
FIG. 3 is an end view of the capillary of FIGS. 1 and 2 viewed in the direction of arrows 3—3 in FIG. 1.

Preferably, shaft portion 20 is cylindrical in shape and has a circular cross section as shown more clearly in FIG. 2. However, other shapes may be used so long as the bonding wire may be threaded through the interior of capillary 10. For example, the capillary may have a rectangular or elliptical cross section. Preferably, capillary 10 is defined by a longitudinal bore of diameter $D_i$ and an outer surface of diameter $D_o$. Preferably, inner diameter $D_i$ is constant throughout an entire length of capillary 10. However, if capillary 10 has a constant wall thickness, then $D_i$ will vary according to changes in $D_o$.

Preferably, tip portion 30 is tapered downwardly and inwardly from a first point 31, where tip portion 30 meets shaft portion 20, to a second point 32 located at the exit end of capillary 10. Preferably, the outer diameter of tip portion 30 at first point 31 is equal to $D_o$ of shaft portion 20. Preferably, the outer diameter of tip portion 30 at second point 32 is a predetermined value which is less than the outer diameter at first point 31. Capillary 10 may have a circular or non-circular face.

Capillary 10 may be formed from any suitable material. However, it is preferable that capillary 10 is formed from a high-strength material. For example, capillary 10 may be formed from a high-strength ceramic material.

Figure 5:
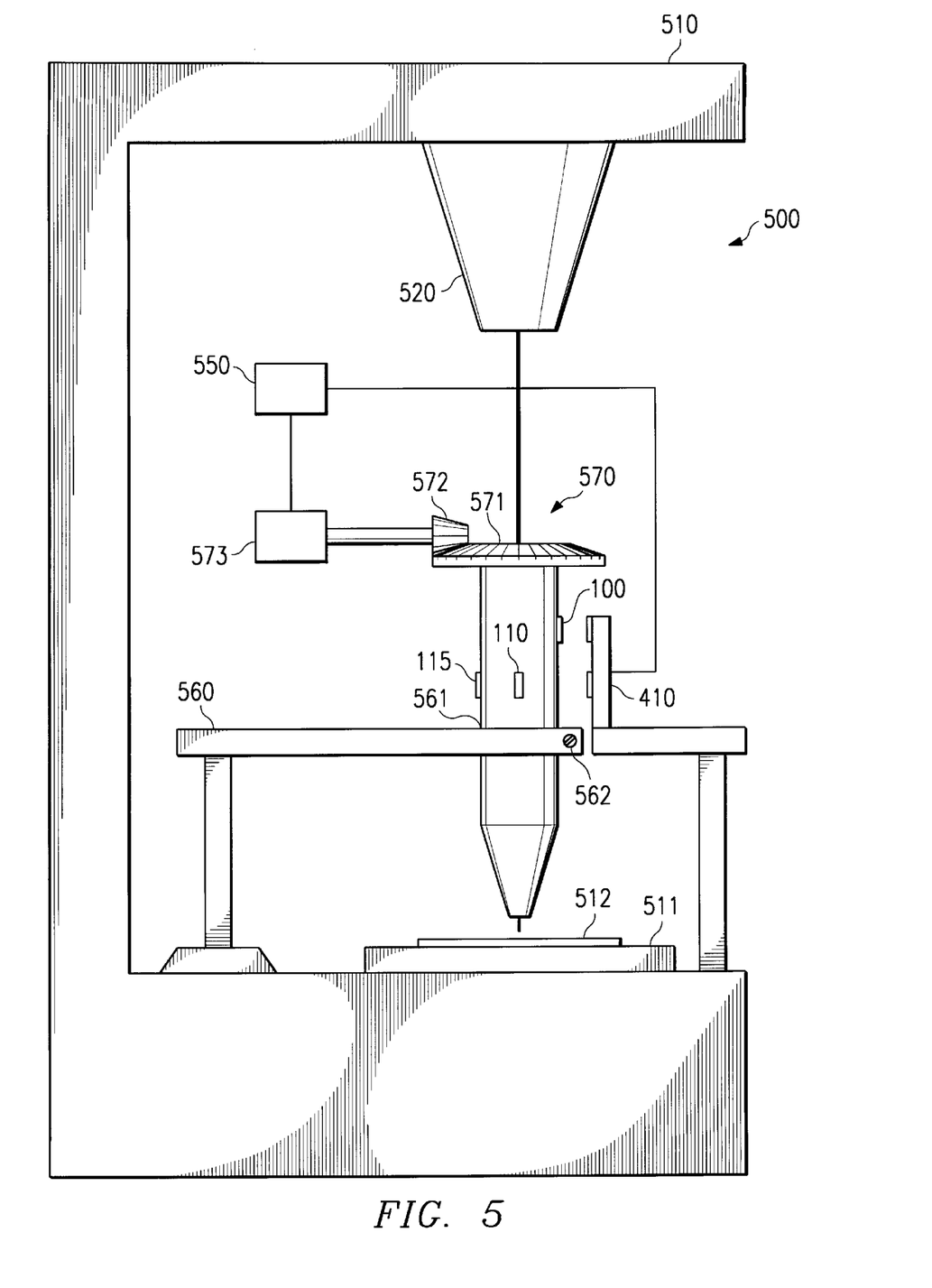
FIG. 5 is a wire bonding capillary alignment system in accordance with a second embodiment of the present invention.

A horn 560 of a wire bonding machine 500 is depicted in FIG. 5. Horn 560 has a capillary mounting receptacle 561 for mounting capillary 10. Horn 560 also preferably includes a locking mechanism 562 for selectively locking capillary 10 into capillary mounting receptacle 561. Preferably, capillary 10 is freely rotatable about its longitudinal axis within mounting receptacle 561 when locking mechanism 562 is in the unlocked position.

Before the wire bonding process begins, capillary 10 is preferably aligned according to a precise, predetermined, initial rotational alignment. For example, capillary 10 may be aligned so that an axis of the face of capillary 10 is aligned with an axis of the bonding platform or a lead frame, or along the axis of a lead.

During the wire bonding process, it may be necessary to rotate capillary 10 about longitudinal axis AA by a precise angular amount. This may be necessary, for example, to align or realign the axis of the capillary face along a given bonding direction. For instance, a target lead might be oriented fifteen degrees offset counterclockwise from the X-axis. If the face of capillary 10 is initially aligned along the X-axis, then capillary 10 should be rotated precisely fifteen degrees counterclockwise (or 345 degrees clockwise) to ensure optimal bonding on the angularly offset target lead.

According to a first embodiment of the present invention, as shown in FIGS. 1–4, an alignment system 400 is provided to enable precise initial alignment and subsequent rotation of capillary 10. System 400 includes at least one indicator located on capillary 10. System 400 also includes at least one detector separate from capillary 10, but cooperative with the at least one indicator to receive a signal from the indicator which indicates the rotational position of capillary 10.

The at least one indicator can be any of a variety of types. As shown in FIG. 2, for example, capillary 10 has a circular cross section. Capillary 10 is defined by outer surface 11 and inner surface 12. A plurality of indicators are provided on capillary 10 to assist in precise alignment of capillary 10. For instance, indicators 100, 105, 110 and 115 are shown incorporated into the tubular body of capillary 10. Although four indicators are shown, the number of indicators used may be one or more than one. Preferably, the indicators are provided about outer surface 11 of capillary 10. These indicators may be separately formed and affixed to the outer surface 11 of capillary 10 after capillary 10 has been formed. For example, depending upon the type of material used to make a particular indicator, the indicator may be bonded to outer surface 11 by a suitable bonding material which is capable of forming a secure bond between the material of the indicator and the material of the capillary.

Alternatively, the indicator may be incorporated into the capillary itself during manufacture of the capillary. For example, the indicator could be provided at the same time the capillary face is formed. This would aid in ensuring proper angular alignment of the indicator relative to a longitudinal axis of the capillary face. During operation, a desired angular alignment of capillary 10 corresponds to an angular position of at least one indicator about the longitudinal axis AA of the tubular body of capillary 10.

Preferably, at least one of the indicators is a primary indicator. For example, in FIG. 2, indicator 100 is a primary indicator. Primary indicator 100 may be used as the indicator which provides precise initial alignment of capillary 10. The remaining indicators 105, 110 and 115 are secondary indicators, and may be used to determine angular offsets of capillary 10 or to provide alignment after capillary 10 is rotated. Primary indicator 100 may be spaced longitudinally, either above or below, secondary indicators 105, 110 and 115. This permits easy identification of the primary indicator.

During operation, the primary indicator may be positioned on capillary 10 to correspond to a first predetermined angular alignment of the capillary. A secondary indicator may be positioned to correspond to a second predetermined angular alignment of the capillary. Other secondary indicators can be positioned on the capillary to correspond to other predetermined angular alignments of the capillary.

Preferably, each of the indicators is positioned closer to entry end 40 than to exit end 50. This will provide sufficient clearance between the capillary tip and the indicators so that the sensing function will not be affected by operation of the wire bonding machine. Also, if the indicators are too close to the tip of the capillary, they may be subject to damage from heat supplied by the heating element.

The dimensions of a given indicator depend upon the particular application, type of indicator and desired function of the indicator. In at least some applications, it is preferable to have an indicator that is relatively narrow in its horizontal dimension and relatively long in its longitudinal dimension. The relatively narrow width prevents sensing by a detector unless the capillary is properly aligned. The relatively long length provides a larger longitudinal region for the sensing function to be performed. In other words, there is more longitudinal space to detect the indicator or a signal from the indicator. Preferably, the indicator's longitudinal dimension is at least as long as its horizontal dimension. More preferably, the longitudinal dimension is longer than the horizontal dimension. Even more preferably, the longitudinal dimension is at least twice as long as the horizontal dimension. The preferred shape of the indicator will also depend upon the indicator type, application and desired function. A rectangular shape may be used. However, other shapes may be appropriate such as circular, triangular or elliptical shapes.

The indicator may be of a variety of types including both passive and active indicators. Preferably, the indicators are passive. This avoids the need for incorporating a power source, chemicals or complicated electronic circuitry into the indicator. Preferably, the indicators are also contactless. This means that no external components need to come into contact with the indicators in order to provide the sensing function necessary to achieve alignment.

The at least one indicator may be an optical indicator. The indicator may comprise a strip of paint applied to the exterior of the capillary. For example, a white capillary may have black, silver, or some other color paint strips applied to the capillary exterior surface to function as indicators. Alternatively, the indicator may comprise a reflector or mirror or a highly polished material.

Figure 4:
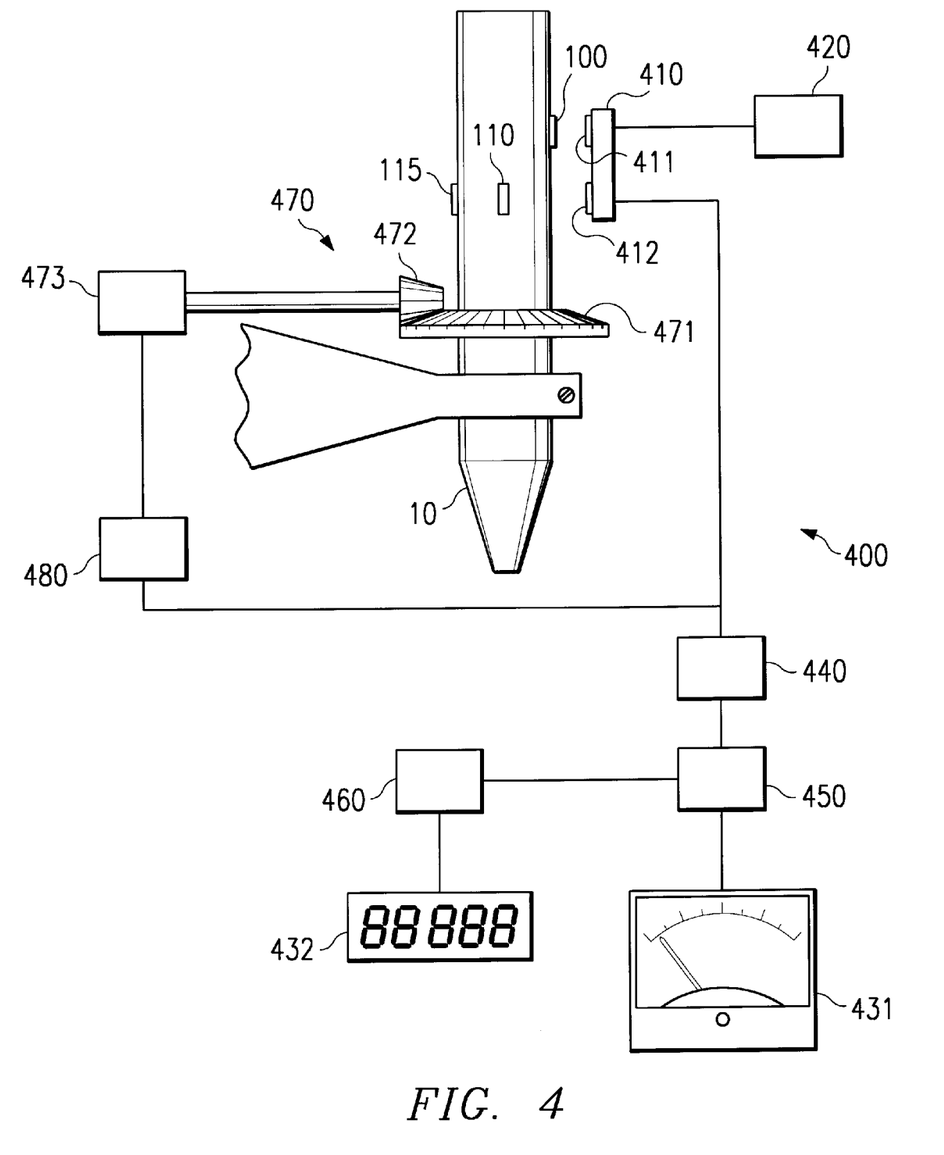
FIG. 4 is a wire bonding capillary alignment system in accordance with a first embodiment of the present invention.

If paint strips are used, for example, the strips may be detected by a sensing unit 410 (FIG. 4). Detection device 410 may include detector 411 at position corresponding to the longitudinal location of the primary indicator and detector 412 corresponding to the longitudinal location of the secondary indicators. Detectors 411 and 412 detect the indicators or signals provided by the indicators. For instance, detectors 411 and 412 may comprise laser detectors for optically sensing paint strip indicators on the capillary surface.

If a mirror is used, for example, a beam of light from a source may be directed to the mirror and reflected from the mirror to be received by the at least one second sensing device, such as an optical detector. The optical detector should be positioned so as to receive a reflected beam of light when the mirror is in a position corresponding to a predetermined desired alignment. For example, a primary indicator may be positioned on capillary 10 such that when the primary indicator is in a first predetermined position, capillary 10 is in a precisely correct initial alignment. The optical detector may be positioned to receive a reflected beam of light when the primary indicator is in the correct initial angular position.

This is particularly useful when the face 60 of capillary 10, which is located at the exit end 50, is a non-circular face. For example, in FIG. 3, the face 60 of capillary 10 is shown from an end view taken along line 3—3 of FIG. 2. Non-circular capillary face 60 has longitudinal axis BB which may be aligned, for example, with an axis of a lead frame and/or the bonding platform of a wire bonding machine, or with the axis of a particular lead. When primary indicator 100 is in the first predetermined position, a longitudinal axis BB of capillary face 60 is preferably aligned in a desired orientation. For example, in the initial state it may be desired that longitudinal axis BB is aligned with the X-axis of the lead frame which is undergoing the wire bonding process.

A second type of contactless indicator which may be used is a magnetic indicator. In this case, the indicator may be formed from a magnetic material and the second sensing device may be formed from a complimentary material which causes a measurable magnetic attraction between the detector and the indicator. The magnetic attraction would naturally be strongest when the indicator and detector are in closest proximity. In the case of a capillary having a shaft with a circular cross section, such as shown in FIG. 2, for any given indicator there will only be one point when the magnetic indicator and the detector are in this closest proximity. It is preferable that the capillary 10 is in the desired alignment at this point. For example, when a primary optical indicator and optical detector are in their closest proximity, it may be desirable to have the longitudinal axis of a non-circular capillary face 60 be aligned as desired for the initial state (e.g., aligned with the X or Y axis of the lead frame as described above).

A contact indicator may also be used. One type of contact indicator is an electrical indicator. This may comprise any conductive material. Preferably, if the indicator is in the appropriate location such that capillary 10 is aligned as desired, a detector, which may comprise, for example, a pair of electrical leads coupled to an electrical circuit, will be in contact with the indicator. The indicator thus completes the electrical circuit which may signal detection and, therefore, proper alignment of the capillary.

A mechanical indicator may also be used. A mechanical indicator may comprise a notch, a hole, a protrusion or some other mechanical-type feature which may be sensed upon contact by a detector. As another example, part or whole of the capillary outer surface may be rectangular. A mechanical indicator may also be contactless. For example, a laser may be used as the detector to detect a mechanical indicator without physical contact.

Preferably, the indicators are proximity-type indicators. This means that detection or sensing is determined by how close the indicator is to the detector. According to one possible configuration, sensing is only achieved when the indicator and detector are in their closest proximity to one another. According to an alternative configuration if a detection signal is provided, the detection signal is strongest when the indicator and detector are in their closest proximity to one another. The signal weakens as the detector and indicator move away from one another. For example, depending on the type of indicator and detector used, a detection signal may still be produced even if the capillary is angularly offset from the initial alignment. In this case the angle of offset may be determined from the relative strength or weakness of the detection signal with reference to a minimum value (as when the indicator is furthest from the detector) and a maximum value (as when the indicator and detector are in closest proximity).

As described above, the at least one indicator cooperates with at least one detector to provide a sensing signal indicative of capillary alignment. The at least one detector is any suitable device, such as a circuit, magnet, optical detector or mechanical detector, which corresponds to the at least one indicator. Preferably, the detector receives information from the indicator. This information may be used to determine the rotational position of capillary 10. The detector may function as a transducer to receive information and provide a corresponding signal to an operator or another component.

In accordance with the first embodiment, as depicted in FIG. 4, system 400 is provided to initially align capillary 10 according to a precise, predetermined, initial rotational alignment. System 400 is also used to realign capillary 10 to precise rotational positions during the wire bonding process. For example, primary indicator 100 may be used as the indicator which provides precise initial alignment of capillary 10. Primary indicator 100 may be aligned along axis BB of capillary face 60. A secondary indicator (e.g., indicator 110) may be used for ensuring precise rotation during wire bonding.

In the example shown in FIG. 4, the at least one indicator is a passive optical indicator, which may be detected by sensing unit 410. If a mirror is used, a beam of light from a source (e.g., power supply 420) may be directed to the mirror and reflected from the mirror to be received by at least detector. In this example, sensing unit 410 includes first and second optical detectors 411 and 412. The optical detectors should be positioned so as to detect corresponding primary or secondary indicators when they are in positions which correspond to predetermined desired alignments.

Preferably, system 400 also includes a power supply 420. The type of power supply depends upon the type of indicators being used in the alignment system. Preferably, power supply 420 provides a source of electricity for sensing unit 410 to function as a transducer. Depending upon the type of sensing components, additional information may be provided by power supply 420. For example, in the case of optical indicators, power supply 420 may also provide the light source for directing a beam of light onto the indicators. In the case of purely mechanical indicators, for example, additional information from power supply 420 might not be necessary.

Sensing unit 410 preferably provides one or more output signals to at least one display. For example, an output signal may be provided to a first display 431 and a second display 432. First display 431 is an analog display for indicating the strength of an output signal from sensing unit 410. Second display 432 is a digital display for indicating the strength of an output signal from sensing unit 410. First and second displays 431 and 432 may indicate the strength of the same signal or may indicate the strengths of first and second signals or multiple signals. For example, first display 431 may indicate the strength of a first signal produced by first optical detector 411 while second display 432 indicates the strength of a second signal produced by second optical detector 412.

Preferably all output from the sensing unit 410 is passed through a filter 440 and an amplifier 450. Also, signals passed to digital display 432 should be passed through an analog-to-digital converter 460.

Rotation of capillary 10 is preferably provided by a rotation device 470. In the example, shown in FIG. 4, rotation device 470 comprises a capillary holder 471, a rotator 472 and a drive element 473. Preferably, capillary holder 471 and rotator 472 comprise any suitable corresponding first and second rotation elements, respectively. Drive element 473 is coupled to the second rotation element by a drive shaft. Drive element 473 rotates second rotation element 472, which engages first rotation element 471 to rotate first rotation element 471. Because first rotation element 471 is coupled to capillary 10, rotation is consequently imparted to capillary 10.

First rotation element 471 may comprise a holder which grips a surface of capillary 10. Optionally, first rotation element 471 may include a rotation element coupled to, and surrounding, capillary 10 about a central portion thereof. Rotation device 470 may include any suitable system of gears or friction pads. In another alternative, rotation device 470 is replaced by an operator who manually turns capillary 10. Preferably, rotation device 470 is connected to a computer/controller 480 which is also connected to an output of sensing unit 410. Computer 480 receives a signal input from sensing unit 410 and feeds corresponding messages to drive element 473. Thus, system 400 is preferably a closed-loop system and the entire alignment process, including the sensing and rotating functions, may be fully automated.

To achieve a precise initial alignment, for example, primary indicator 100 may be positioned on capillary 10 such that when primary indicator 100 is in a first predetermined position, capillary 10 is in a precisely correct initial alignment. First optical detector 411 may be positioned to detect primary indicator 100 when indicator 100 is in the correct initial angular position.

Preferably, first optical detector 411 detects primary optical indicator 100 even if indicator 100 is not in closest proximity to detector 411. When indicator 100 is detected by detector 411, a signal is produced. The signal has a relative strength which corresponds to the distance between primary indicator 100 and first optical detector 411. A greater distance results in a weaker relative signal strength and a smaller distance results in a stronger relative signal strength. Therefore, if the indicator 100 is in closest proximity to first optical detector 411, then the signal strength is at its strongest value. Thus, there is an optimal sensing signal. It should be noted that any of the indicators may be used to achieve initial alignment. For instance, secondary indicator 110 may be offset ninety degrees from the desired initial alignment. If sensing unit 400 detects secondary indicator 110, and produces a signal having a relative strength, one of the indicators can be calibrated to indicate that indicator 110 is in the ninety degree-offset position based on the relative strength of the signal.

System 400 can also be used to rotate capillary 10 to desired angular positions and to establish and confirm rotational alignment and realignment of the capillary during the wire bonding process. For example, it may be desirable to rotate the capillary so that it is angularly offset from an X or Y axis by a predetermined amount. For instance, the desired angular offset from the initial point might be thirty degrees clockwise from the X axis. In this situation, a detection signal produced by optical detector 481 detecting primary indicator 100 (or a signal therefrom) will be weaker than if first optical detector 411 and indicator 100 were in closest proximity. The relative strength of the detection signal can be used to determine whether the capillary is properly offset. In other words, by calibration or some other suitable technique, a signal strength would correspond to a particular angular offset. In this example, when the capillary is offset thirty degrees clockwise as desired, the strength of the signal indicates that primary indicator 100 is offset thirty degrees clockwise from a point on the capillary which is closest to optical detector 411. The signal strength can be displayed on one or both of the first and second indicators. Optionally, second optical detector 412 may detect a signal from secondary indicator 105, which indicates that secondary indicator 105 is offset counterclockwise by sixty degrees. This second signal can be displayed on the second indicator, for example, while the first signal is displayed on the first indicator.

According to another example of the operation of the alignment system, a first predetermined angular alignment of the capillary is established. A first indicator is incorporated into the capillary, so that an angular position of the first indicator corresponds to the angular alignment of the capillary. A first angular position of the first indicator is detected to determine the angular alignment of the capillary. The first angular position of the first indicator is compared to the first predetermined angular alignment to determine a first angular offset of the capillary from the first predetermined angular alignment. The capillary is rotated in the correct direction by the amount of the first angular offset to align the capillary according to the first predetermined angular alignment.

After a capillary is rotated, a second angular position of the first indicator may be detected to determine the angular alignment of the capillary. The second angular position of the first indicator may be compared to the first predetermined angular alignment to determine a second angular offset of the capillary from the first predetermined angular alignment. The capillary may then be rotated according to the second offset.

According to an aspect of this example, a second indicator may be incorporated into the capillary, so that an angular position of the second indicator corresponds to an angular alignment of the capillary. A first angular position of the second indicator may be detected to determine the angular alignment of the capillary. The first angular position of the second indicator may be compared to the first predetermined angular alignment to determine an angular offset of the capillary from the first predetermined angular alignment. According to other features, an angular offset determined by one indicator's position may be compared to another indicator's angular offset in order to check and establish exact alignment.

In accordance with a second embodiment of the present invention, as depicted for example in FIG. 5, an alignment system 500 includes a wire bonding machine 510. Capillary 10 may be incorporated into wire bonding machine 510. Machine 510 includes mounting platform 511 which is adapted to receive a lead frame 512 for wire bonding. Machine 510 also includes horn 560 attached thereto. Horn 560 has capillary 10 mounted thereon and may be manipulated to wire bond lead frame 512 resting on mounting platform 511. Machine 510 also includes a source (e.g., a spool) of bonding wire 520 mounted thereon. The bonding wire may be threaded through capillary 10 and used to complete wire bonds on the lead frame. In FIG. 5, a primary indicator 100 is shown in its closest proximity with sensing unit 410. Sensing unit 410 is preferably coupled to other components of system 400 as described above including power supply 420 and first and second indicators 431 and 432. A rotation device 570 is provided which includes, for example, capillary holder 571 coupled to capillary 10, and rotator 572 engaging holder 571. Rotation device 570 also includes drive element 573 which is coupled to rotator 572 by a drive shaft.

FIG. 5 is shown as an example of the operation of a capillary alignment system incorporated into a wire bonding machine. The indicators and detectors may be used to establish precise initial alignment of the capillary 10 with respect to horn 560, bonding platform 511 and/or lead frame 512, or with respect to an axis of a particular lead. After initial alignment, and during the wire bonding process, the sensing components may be used in conjunction with rotation device 570 to precisely rotate capillary 10 to realign the capillary face to a different bonding direction as described above. The sensing components may also be used to confirm the proper desired rotational alignment of capillary 10.

According to another feature of the present invention, rotation and alignment may be completely controlled by a computer 550. In this situation, the computer 550 determines the desired rotational position of the capillary. This can be established based on a predetermined configuration of a lead frame. The computer, with input from the sensing devices, determines the appropriate amount of rotation and sends a message which activates rotation device 570. Another message is sent from the computer to deactivate the locking mechanism 562 of horn 560 so that rotation device 570 may rotate capillary 10. When the sensing devices sense that capillary 10 has reached the desired rotational position, input is sent from the sensing devices (e.g., sensing unit 410) to the computer. The computer sends an activation message to the locking mechanism and a deactivation message to the rotation device. The bonding machine may then proceed with bonding.

According to an aspect of this feature, other sensing devices (not shown) are provided to sense the orientation of individual leads directly. This may be accomplished, for example, by known scanning techniques. This information is transmitted to the computer, which sends corresponding activation and deactivation messages to the rotation device and the locking mechanism. The rotation device rotates the capillary to an exact position based on the orientation for a particular lead, as opposed to a predetermined orientation of a lead frame stored in the computer memory. The sensing devices send further input to the computer when the capillary reaches the correct rotational position and the computer sends the appropriate activation and deactivation messages to the locking mechanism and rotation device, respectively.

The present invention has thus been described in connection with the preferred embodiments, which are intended as examples only. It will be appreciated by those having ordinary skill in the relevant art that modifications may be made to these embodiments without departing from the scope and spirit of the invention as defined by the appended claims.

What is claimed is:

1. A system for aligning a wire bonding capillary, the system comprising:
   at least one indicator located on the capillary; and
   at least one detector cooperating with the at least one indicator to provide a signal corresponding to a rotational alignment of the capillary.

2. The system of claim 1, wherein the signal has a strength, the system further comprising a first display coupled to at least one of the at least one indicator to display the strength of the signal.

3. The system of claim 2, the first display comprising an analog display.

4. The system of claim 2, the first display comprising a digital display.

5. The system of claim 4, further comprising a second display, the second display comprising an analog display.

6. The system of claim 1, wherein the at least one indicator and the at least detector cooperate to provide a signal having a strength based on a distance between the at least one indicator and the at least one detector.

7. The system of claim 1, wherein a point on the capillary is closest to the at least one detector, and wherein the at least one indicator and the at least one detector cooperate to provide a signal having a strength based on an angular offset between the at least one indicator and the point on the capillary.

8. The system of claim 1, wherein the at least one indicator comprises a first indicator and a second indicator, the first indicator cooperating with the at least one detector to provide a first signal corresponding to a rotational alignment of the capillary, the second indicator cooperating with the at least one detector sensing device to provide a second signal corresponding to the rotational alignment of the capillary.

9. The system of claim 8, wherein the first and second signals each have a strength, the system further comprising first and second displays for displaying the first and second signal strengths, respectively.

10. The system of claim 1, wherein the at least one indicator comprises a first indicator and a second indicator, wherein the at least one detector comprises a first detector and a second detector, the first indicator cooperating with the first detector to provide a first signal corresponding to a rotational alignment of the capillary, the second indicator cooperating with the second detector to provide a second signal corresponding to a rotational alignment of the capillary.

11. The system of claim 10, wherein the first and second signals each have a strength, the system further comprising a first display electrically connected to the first detector to display the first signal strength, and a second display electrically connected to the second detector to display the second signal strength.

12. The system of claim 1, wherein the signal has a strength corresponding to an alignment of the capillary.

13. A system for aligning a wire bonding capillary, the system comprising:

a capillary;

an indicator located on the capillary and adapted to provide information relating to alignment of said capillary; and a detector spaced from the capillary and adapted to receive the information from the indicator and provide a signal based on the information received from the indicator.

14. The system of claim 13, wherein the signal has a strength, the system further comprising a display coupled to the detector for displaying the strength of the signal.

15. The system of claim 13, wherein the signal has a strength corresponding to an alignment of the capillary.

16. A wire bonding system, comprising:

a wire bonding machine;

a capillary rotatably mounted on the wire bonding machine; and at least one indicator coupled to the capillary for producing a signal based on a rotational alignment of the capillary.

17. The system of claim 16, wherein the signal has a strength, the system further comprising a display electronically coupled to at least one indicator for displaying the strength of the signal.

18. The system of claim 16, further comprising a computer, the computer controlling rotation of the capillary in response to a signal produced by the at least one indicator.

19. The system of claim 16, wherein the system is used to wire bond a lead frame, the system further comprising a computer, the computer controlling rotation of the capillary in response to an orientation of the lead frame.

20. The system of claim 16, wherein the system is used to wire bond a lead frame, the system further comprising a computer, the computer controlling rotation of the capillary in response to stored information corresponding to an orientation of the lead frame.

* * * * *